(12) United States Patent
Herrault et al.

(10) Patent No.: US 10,998,273 B2
(45) Date of Patent: May 4, 2021

(54) HYBRID INTEGRATED CIRCUIT ARCHITECTURE

(71) Applicant: HRL Laboratories, LLC, Malibu, CA (US)

(72) Inventors: Florian G. Herrault, Malibu, CA (US); David Brown, Malibu, CA (US); Hasan Sharifi, Malibu, CA (US); Joel C. Wong, Malibu, CA (US); Dean C. Regan, Malibu, CA (US); Yan Tang, Malibu, CA (US); Helen Fung, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/158,212

(22) Filed: Oct. 11, 2018

(65) Prior Publication Data
US 2019/0198449 A1   Jun. 27, 2019

Related U.S. Application Data

(60) Provisional application No. 62/610,099, filed on Dec. 22, 2017.

(51) Int. Cl.
*H01L 23/538* (2006.01)
*H01L 23/482* (2006.01)
(Continued)

(52) U.S. Cl.
CPC .......... *H01L 23/5389* (2013.01); *H01L 21/56* (2013.01); *H01L 21/6835* (2013.01);
(Continued)

(58) Field of Classification Search
CPC .................................................. H01L 23/4827
See application file for complete search history.

(56) References Cited

U.S. PATENT DOCUMENTS

| 8,617,927 B1 | 12/2013 | Margomenos |
|---|---|---|
| 9,214,404 B1 | 12/2015 | Margomenos |

(Continued)

FOREIGN PATENT DOCUMENTS

KR   10-2013-0117329   10/2013

OTHER PUBLICATIONS

U.S. Appl. No. 16/557,811, filed Aug. 30, 2019, Herrault.
(Continued)

*Primary Examiner* — Omar F Mojaddedi
(74) *Attorney, Agent, or Firm* — Ladas & Parry

(57) ABSTRACT

An electronic assembly, comprising a carrier wafer having a top wafer surface and a bottom wafer surface; an electronic integrated circuit being formed in the carrier wafer and comprising a wafer contact pad on the top wafer surface; said carrier wafer comprising a through-wafer cavity joining the top and bottom wafer surfaces; a component chip having a component chip top surface, a component chip bottom surface and component chip side surfaces, the component chip being held in said through-wafer cavity by direct contact of at least a side surface of said first component chip with an attachment metal that fills at least a portion of said through-wafer cavity; said component chip comprising at least one component contact pad on said component chip top surface; a first conductor connecting said wafer contact pad and said component contact pad.

19 Claims, 5 Drawing Sheets

(51) Int. Cl.
*H01L 23/367* (2006.01)
*H01L 23/14* (2006.01)
*H01L 23/31* (2006.01)
*H01L 23/48* (2006.01)
*H01L 25/065* (2006.01)
*H01L 25/16* (2006.01)
*H01L 21/56* (2006.01)
*H01L 21/683* (2006.01)
*H01L 25/00* (2006.01)
*H01L 23/00* (2006.01)

(52) U.S. Cl.
CPC .......... *H01L 23/4827* (2013.01); *H01L 24/27* (2013.01); *H01L 25/50* (2013.01); *H01L 2221/68354* (2013.01)

(56) References Cited

U.S. PATENT DOCUMENTS

| | | | |
|---|---|---|---|
| 9,337,124 B1 | 5/2016 | Herrault | |
| 9,385,083 B1 | 7/2016 | Herrault | |
| 9,508,652 B1 | 11/2016 | Herrault | |
| 9,837,372 B1 | 12/2017 | Herrault | |
| 2002/0110952 A1* | 8/2002 | Gris | H01L 25/50 438/106 |
| 2006/0105496 A1* | 5/2006 | Chen | H01L 25/0652 438/106 |
| 2007/0025092 A1 | 2/2007 | Lee | |
| 2008/0224320 A1* | 9/2008 | Palmade | H01L 23/13 257/773 |
| 2011/0140216 A1 | 6/2011 | Qu | |
| 2011/0266569 A1 | 11/2011 | Basin | |
| 2012/0037935 A1* | 2/2012 | Yang | H01L 31/0203 257/98 |
| 2013/0168803 A1 | 7/2013 | Haddad | |
| 2014/0021610 A1* | 1/2014 | Von Koblinski | H01L 23/44 257/741 |
| 2014/0203239 A1 | 7/2014 | Schubert | |
| 2016/0111616 A1 | 4/2016 | Margalit | |
| 2016/0293557 A1 | 10/2016 | Topak | |
| 2016/0308270 A1 | 10/2016 | Ding | |
| 2016/0329232 A1 | 11/2016 | Golda | |
| 2017/0363589 A1 | 12/2017 | Kumar | |
| 2018/0019178 A1* | 1/2018 | Lin | H01L 23/3121 |
| 2018/0148328 A1 | 5/2018 | Agache | |

OTHER PUBLICATIONS

PCT International Search Report and Written Opinion from PCT/US2018/055516 dated Feb. 1, 2019.
Chinoy, P. et al., "Manufacture of low-loss microwave circuits using HMIC technology," 1994 IEEE MTT-S International Microwave Symposium Digest (Cat. No. 94CH3389-4), San Diego, CA, USA, 1994, pp. 1137-1140 vol. 2. doi: 10.1109/MWSYM.1994.335544.
PCT International Search Report and Written Opinion from PCT/US2019/050384 dated Jan. 20, 2020.
From U.S. Appl. No. 16/557,811, Office Action dated May 11, 2020.
PCT International Preliminary Report on Patentability (Chapter I) with Written Opinion from PCT/US2018/055516 dated Jun. 23, 2020.

* cited by examiner

HYBRID INTEGRATED CIRCUIT ARCHITECTURE

RELATED APPLICATIONS

This application claims priority of U.S. provisional application No. 62/610,099; which is hereby incorporated by reference.

STATEMENT REGARDING FEDERALLY SPONSORED RESEARCH OR DEVELOPMENT

This invention was made with Government support under contract number FA8650-13-C-7324, awarded by the DARPA. The Government has certain rights in the invention.

TECHNICAL FIELD

This presentation relates to electronic assemblies; in particular electronic assemblies comprising one or more microelectronic components integrated into a microelectronic wafer fabricated separately.

BACKGROUND

Electronic assemblies, or hybrid circuits, comprise microelectronic circuits fabricated separately and assembled together so as to form a single component, which can itself be encapsulated in an electronic circuit package. Assembling microelectronic circuits fabricated separately allows one to, for example, test all the microelectronic circuits separately, prior to assembling them, which, in turn enables improved fabrication yields of the final component. This capability is particularly significant if some of the microelectronic circuits fabricated separately are difficult and/or expensive to manufacture. Assembling microelectronic circuits fabricated separately also allows one to combine microelectronic circuits, which themselves employ different materials and different manufacturing processes, into a single final component. This capability can lead to higher circuit performance.

The reference, "P. Chinoy, N. Jain, Ping Li, J. Goodrich and C. Souchuns, "Manufacture of low-loss microwave circuits using HMIC technology," 1994 *IEEE MTT-S International Microwave Symposium Digest* (Cat. No. 94CH3389-4), San Diego, Calif., USA, 1994, pp. 1137-1140 vol. 2. doi: 10.1109/MWSYM.1994.335544" discloses a low-cost, batch-processed, surface-mountable, microwave manufacturing technology that provides hybrid-type flexibility with monolithic-type passive components with repeatability and precision. The reference discloses, in particular, power amplifier circuits with high power-added efficiencies and reduced size paving the way for low-cost, high-performance circuits for wireless communication markets.

U.S. Pat. Nos. 8,617,927 and 9,214,404, which are hereby incorporated by reference in their entirety, disclose a method and apparatus for mounting microelectronic chips to a thermal heat sink. The chips are arranged in a desired configuration with their active faces all facing a common direction and with their active faces defining a common planar surface for all of said chips. A metallic material is applied to the chip, preferably by electroplating to backsides of the chips, the metallic material being electro-formed thereon and making void-free contact with the backsides of the chips.

U.S. Pat. No. 9,508,652, which is hereby incorporated by reference in its entirety, discloses a method for wafer level packaging that includes forming one or more die, forming a plated metal ring (PMR) on each die, forming a cover wafer (CW), the CW having one or more plated seal rings, forming a body wafer (BW), the BW having cavities and a metal layer on a first side of the BW, aligning a respective die to the CW so that a PMR on the respective die is aligned to a respective plated seal ring (PSR) on the CW, bonding the PMR on the respective die to the respective PSR, aligning the BW to the CW so that a respective cavity of the BW surrounds each respective die bonded to the CW and so that the metal layer on the BW is aligned with at least one PSR on the CW, and bonding the metal layer on the first side of the BW to the PSR on the CW. Each PMR has a first height and each PSR has a second height.

U.S. Pat. Nos. 9,837,372 and 9,385,083, which are hereby incorporated by reference in their entirety, disclose an interconnect and manufacturing method for electrically coupling pads formed on adjacent chips (or on packaging material adjacent the chips) with an electrically conductive heat sink being disposed between the pads, the interconnect comprising a metallic membrane layer disposed between two adjacent pads and disposed or bridging over the electrically conductive heat sink so as to avoid making electrical contact with the electrically conductive heat sink. An electroplated metallic layer is disposed on the metallic membrane layer. Multiple interconnects can be formed in parallel using manufacturing techniques compatible with wafer level fabrication of the interconnects. The interconnects preferably follow a smooth curve to electrically connect adjacent pads and following that smooth curve they bridge over the intervening electrically conductive heat sink material in a predictable fashion.

U.S. Pat. No. 9,337,124, which is hereby incorporated by reference in its entirety, discloses a method for forming a wafer level heat spreader that includes providing a mesh wafer, the mesh wafer having a plurality of openings and mesh regions between the openings, bonding the mesh wafer to a backside of an integrated circuit (IC) wafer, the IC wafer comprising a plurality of circuits; and electroplating a heat sink material through the plurality of openings and onto to the backside of the IC wafer.

There remains a need for an electronic assembly or hybrid component that is easier and more economical to manufacture with high manufacturing yields than those presently known.

SUMMARY

Embodiments of the presentation comprise an electronic assembly or hybrid circuit where a microelectronic circuit in a wafer is connected to a microelectronic circuit in a chip; the chip being embedded in a metal-filled cavity of the wafer.

An embodiment of this presentation comprises an electronic assembly, having: a carrier wafer having a top wafer surface and a bottom wafer surface; an electronic integrated circuit being formed in the carrier wafer and comprising a first integrated circuit contact pad on the top wafer surface; said carrier wafer comprising a through-wafer cavity having walls that join said top wafer surface to said bottom wafer surface; a first component chip having a first component chip top surface, a first component chip bottom surface and first component chip side surfaces, the first component chip being held in said through-wafer cavity by direct contact of at least a side surface of said first component chip with an attachment metal that fills at least a portion of said through-wafer cavity; said first component chip comprising at least one first component contact pad on said first component chip top surface; and a first conductor connecting said first integrated circuit contact pad and said first component contact pad.

According to an embodiment of this presentation, the attachment material holds the first component chip such that the first component chip top surface is flush with the top wafer surface.

According to an embodiment of this presentation, the attachment material is a metal.

According to an embodiment of this presentation, the attachment material fills the cavity and a metal layer covers at least a portion of the bottom wafer surface as well as the attachment material in the cavity.

According to an embodiment of this presentation, the walls of the through-wafer cavity are covered with a dielectric layer.

According to an embodiment of this presentation, the attachment material contacts at least most of each first component chip side surface.

According to an embodiment of this presentation, the carrier wafer and the first component chip are made of different materials.

According to an embodiment of this presentation, the first component chip is an integrated circuit chip comprising one or more transistors.

According to an embodiment of this presentation, the carrier wafer and the first component chip have a different thickness.

According to an embodiment of this presentation, the electronic assembly comprises a second component chip also held in said through-cavity by said attachment material, said attachment material attaching at least one of a bottom and a side surface of the second component chip to at least one wall of the through wafer cavity; said second component chip comprising at least one second component contact pad on a top surface of the second component chip; the electronic integrated circuit formed in the carrier wafer comprising a second integrated circuit contact pad on the top wafer surface; wherein a second conductor connects the second integrated circuit contact pad and the second component contact pad.

According to an embodiment of this presentation, the attachment material holds the first component chip such that the first component chip top surface is flush with the top wafer surface; and the attachment material holds the second component chip such that the top surface of the second component chip is flush with the top wafer surface.

According to an embodiment of this presentation, the attachment material is a metal that embeds the second component chip and the first component chip in the through-wafer cavity.

Another embodiment of this presentation relates to a method of manufacturing an electronic assembly, the method comprising: providing a first component chip having a first component chip top surface, a first component chip bottom surface and first component chip side surfaces; said first component chip comprising at least one first component contact pad on said first component chip top surface; providing a handle wafer having a first surface; attaching said first component chip top surface to said first surface of said handle wafer; providing a carrier wafer having a top wafer surface and a bottom wafer surface; forming in the carrier wafer an electronic integrated circuit having a first integrated circuit contact pad on the top wafer surface; forming in the carrier wafer a through-wafer cavity having walls that join said top wafer surface to said bottom wafer surface; attaching said top wafer surface to said first surface of said handle wafer such that said first component chip is arranged within said through-wafer cavity; filling at least a portion of said through-wafer cavity with an attachment material attaching at least one wall of the through-wafer cavity to at least one of the first component chip bottom surface and one first component chip side surface; detaching the handle wafer from the first component chip top surface and the top wafer surface; and forming a first conductor between the first integrated circuit contact pad and said first component contact pad.

According to an embodiment of this presentation, the attachment material is a metal, said filling at least a portion of said through-cavity with said attachment material comprising: electroplating said attachment material on said at least one wall of the through-cavity and at least one of the first component chip bottom surface and one first component chip side surface.

According to an embodiment of this presentation, said filling at least a portion of said through-cavity with said attachment material comprises depositing a film of metal on said at least one wall of the through-cavity and at least one of the first component chip bottom surface and one first component chip side surface before said electroplating.

According to an embodiment of this presentation, said filling at least a portion of said through-cavity with said attachment material comprises filling the cavity up to the bottom wafer surface with said attachment material; the method further comprising, covering with a metal layer at least a portion of the bottom wafer surface as well as the attachment material in the cavity.

According to an embodiment of this presentation, the method comprises covering the walls of the through-wafer cavity with a dielectric layer before said filling at least a portion of said through-wafer cavity with an attachment material.

According to an embodiment of this presentation, the carrier wafer and the first component chip are made of different semiconductor materials.

According to an embodiment of this presentation, said forming in the carrier wafer an electronic integrated circuit having a first integrated circuit contact pad on the top wafer surface comprises: forming in the carrier wafer an electronic integrated circuit having a first and a second integrated circuit contact pads on the top wafer surface; the method further comprising: providing a second component chip having a top surface with a second component contact pad; attaching said top surface of the second component chip to said first surface of said handle wafer in a vicinity of said first component chip such that, when said top wafer surface is attached to said first surface of said handle wafer, both the first component chip and the second component chip are arranged within said through-wafer cavity; wherein said attachment material also attaches at least a side surface or a bottom surface of the second component chip to said at least one wall of the through-cavity; and after detaching the handle wafer from the top chip surface and the top wafer surface; forming a second conductor between the second integrated circuit contact pad and the second component contact pad.

According to an embodiment of this presentation, the attachment material holds the first component chip such that the first component chip top surface is flush with the top wafer surface; and the attachment material holds the second component chip such that the top surface of the second component chip is flush with the top wafer surface.

FIGURES

Figure 4:
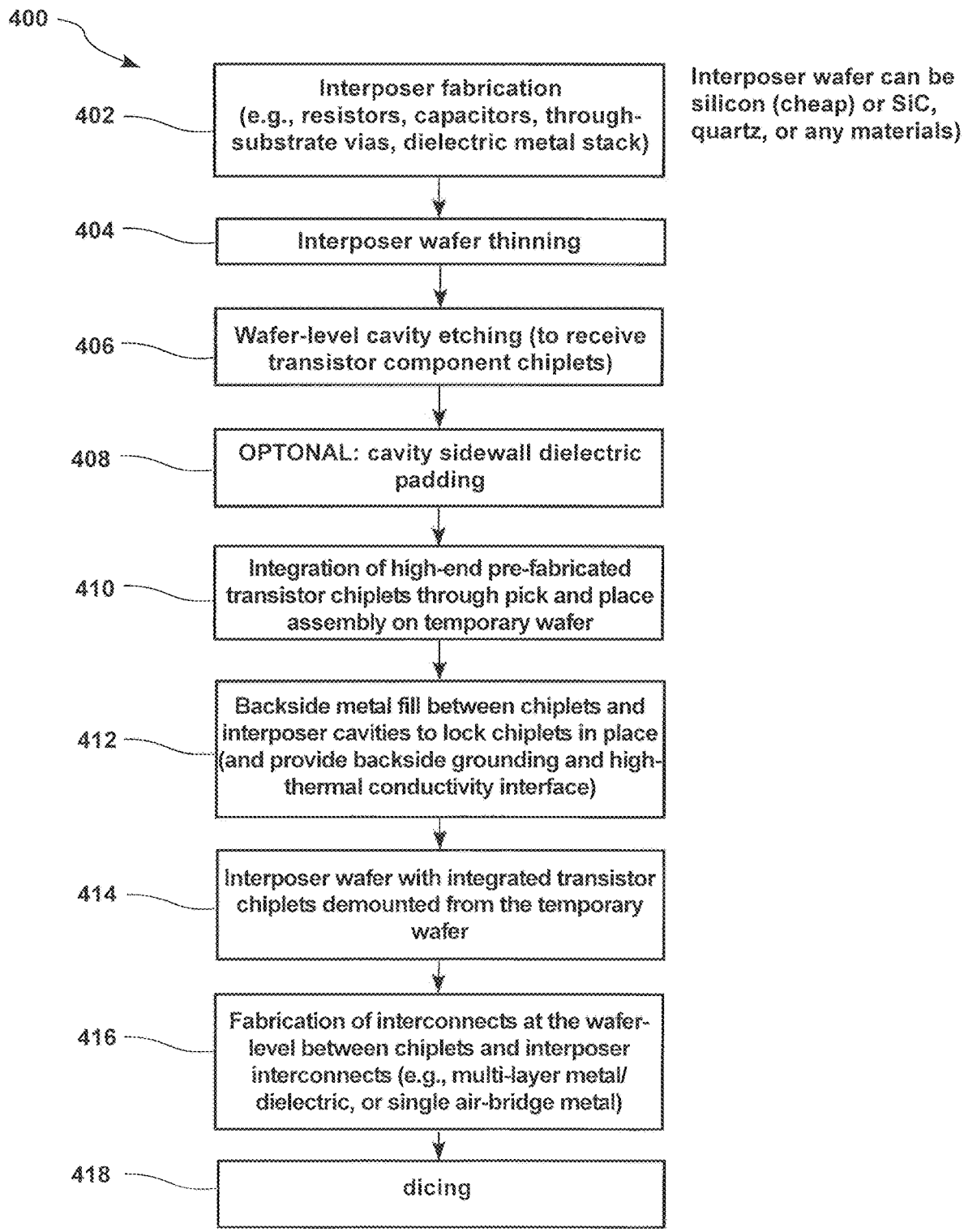

FIG. 4 outlines a process of manufacturing an electronic assembly according to embodiments of this presentation.

Figure 5:
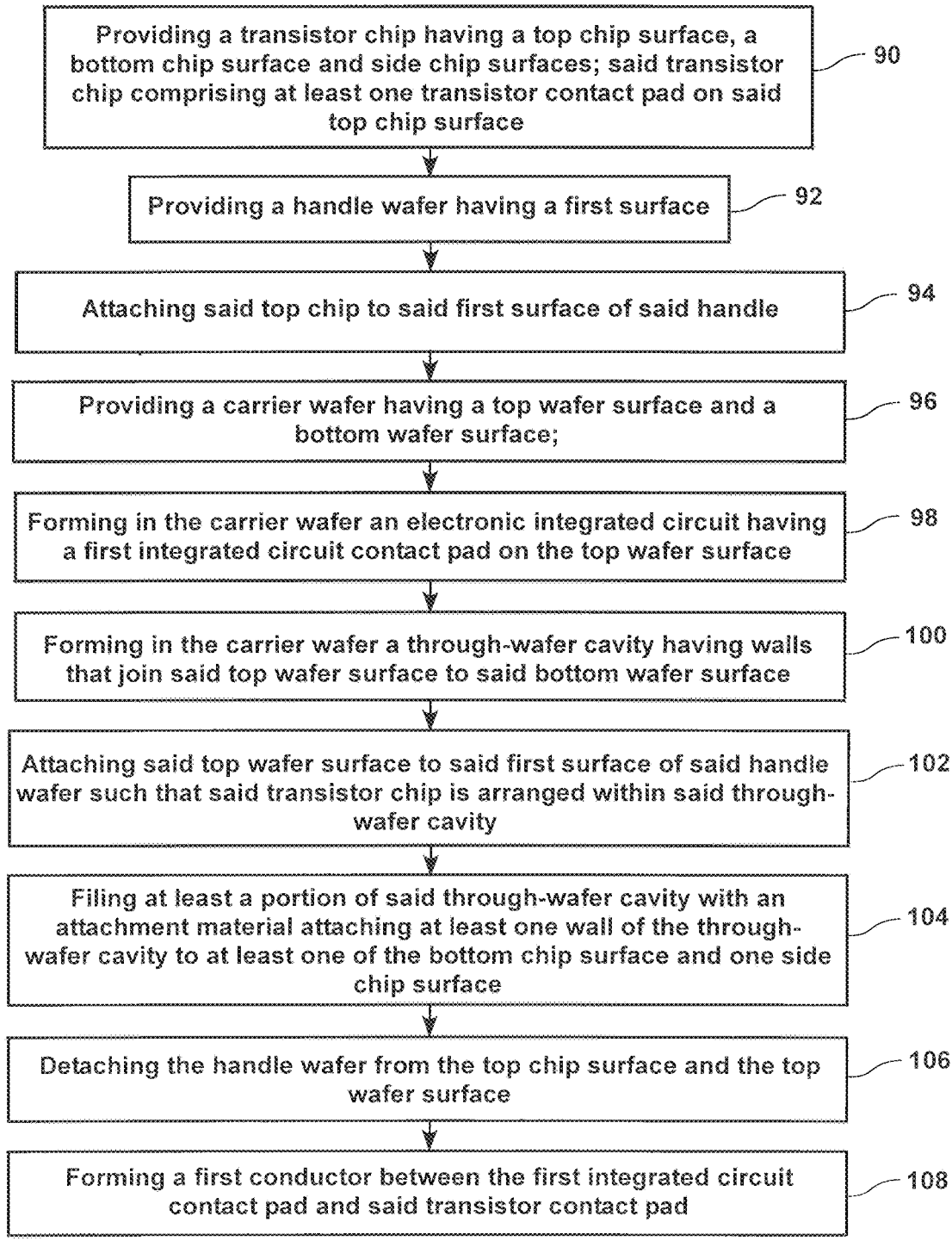

FIG. 5 outlines a process of manufacturing an electronic assembly according to embodiments of this presentation.

DETAILED DESCRIPTION

The following description is presented to enable one of ordinary skill in the art to make and use the teachings of this presentation and to incorporate them in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of embodiments of this presentation. However, it will be apparent to one skilled in the art that such embodiments may be practiced without necessarily being limited to these specific details.

All the features disclosed in this presentation, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

An electronic assembly according to embodiments of this presentation integrates high-performance integrated circuits, such as GaN RF MMICs, into carrier wafers having integrated circuits, such as silicon-based integrated circuits, in a manner that is inexpensive and has high manufacturing yields and short manufacturing cycles.

According to embodiments of this presentation, the high performance integrated circuit or component can comprise III-V transistors or integrated circuits and they can be integrated, eventually together with resistors, inductors, capacitors and matching networks, into the carrier wafers.

Figure 1:
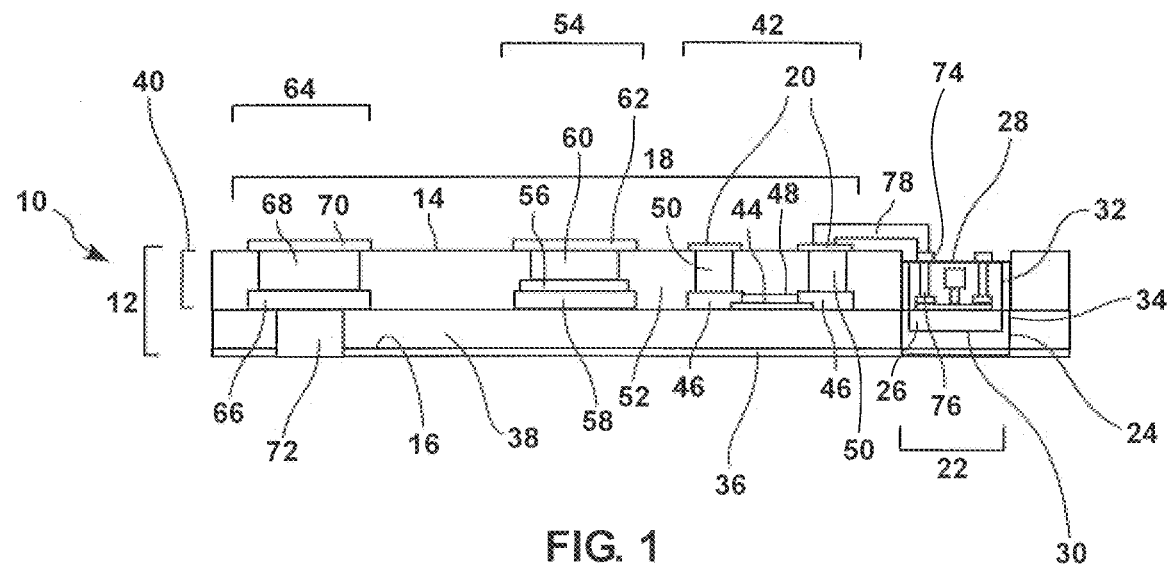
FIG. 1 is a cross-section of an electronic assembly according to an embodiment of this presentation.

FIG. 1 illustrates a cross-section view of an electronic assembly 10 according to embodiments of this presentation, comprising: a carrier wafer 12 having a top wafer surface 14 and a bottom wafer surface 16; an electronic integrated circuit 18 being formed in the carrier wafer and comprising at least one first integrated circuit contact pad 20 on the top wafer surface 14. According to an embodiment of this presentation, carrier wafer 12 comprises at least one through-wafer cavity 22 having walls 24 that join top wafer surface 14 to bottom wafer surface 16. According to an embodiment of this presentation, a first component chip 26 having a top surface 28, a bottom surface 30 and side surfaces 32, is held in the through-wafer cavity 22 by an attachment material 34 that attaches at least one wall 24 of the through-wafer cavity to at least one of the bottom surface 30 and a side surface 32.

According to an embodiment, and as illustrated in FIG. 1, attachment material 34 can be a metal. According to an embodiment of this presentation, attachment material 34 can fill cavity 22, thus attaching most of the side surfaces 32 as well as the whole bottom surface 30 of first component chip 26 to the walls of through-wafer cavity 22.

According to an embodiment of this presentation, a metal layer 36 contacts at least a portion of the bottom wafer surface 16 as well as the attachment material 34 in the cavity 22. As detailed hereafter, having component chip 26 embedded in a metal material 34 filling cavity 22 and said metal material 34 contacting bottom metal layer 36 advantageously allows evacuating efficiently the heat eventually produced by component chip 26.

According to an embodiment of this presentation, attachment material 34 holds the first component chip 26 such that the first component chip top surface 28 is flush with the top wafer surface 14. According to embodiments of this presentation, the first component chip top surface 28 being "flush" with the top wafer surface 14 is to be understood as meaning that the two surfaces are in a same plane, or have, with respect to each other, a small or negligible height difference, such as resulting from the process of permanently attaching first component chip 26 to the walls 24 of through wafer cavity 22 while both the first component chip top surface 28 and the top wafer surface 14 are attached temporarily to a same handle wafer, for example according to a process as illustrated hereafter. At this juncture, it must be emphasized that, for clarity, FIG. 1 is not drawn to scale.

Carrier wafer 12 comprises, for example, a substrate 38, a bottom surface of which forms the bottom surface of wafer 12 and a top surface of which carries one or more integrated circuit layers 40 within which integrated circuit 18 is formed. As illustrated in FIG. 1, integrated circuit 18 can comprise a resistor 42, comprising a strip 44 of a resistive layer arranged between two strips 46 of a conductive layer. Strip 44 can be covered by a strip 48 of a dielectric layer. A passivation layer 52 can be arranged on top of integrated circuit 18; a top surface of passivation layer 52 forming most of the top surface 14 of wafer 12. Conducting vias 50 arranged through passivation layer 52 can connect the two strips 46 to contact pads 20 on top surface 14. Substrate 38 can be a silicon wafer, which allows taking advantage of known fabrication processes and manufacturability on large wafer diameters.

As illustrated in FIG. 1, integrated circuit 18 can alternatively or additionally comprise a capacitor 54, comprising for example a strip 56 of a dielectric layer sandwiched between a strip 58 of a conductive layer formed on a top surface of substrate 38 and a conducting via 60 arranged through passivation layer 52 and connected to a contact pad 62 on top surface 14. As illustrated in FIG. 1, integrated circuit 18 can alternatively or additionally comprise a through wafer via 64, comprising for example a strip 66 of a conductive layer formed on a top surface of substrate 38 in contact with a conducting via 68 arranged through passivation layer 52 and connected to a contact pad 70 on top surface 14. As illustrated in FIG. 1, through wafer via 64 can additionally comprise a conducting via 72 formed through substrate 38, connecting strip 66 and bottom metal 36. It is noted that passive elements 42, 54, 64 are illustrated side by side and non-connected together in FIG. 1 only as examples. It is noted that integrated circuit 18 can comprise any integrated circuit, active or passive, made possible by a chosen manufacturing process; for example, a CMOS manufacturing process. According to an embodiment of this presentation, the thickness of the one or more integrated circuit layers 40 can for example be only a fraction of the thickness of substrate 38 (for example between ⅒ and ⅟₁₀₀₀ of the thickness of substrate 38; for example 50 nm thick with a wafer 50 μm thick). According to an embodiment of this presentation, the thickness of substrate 38 can be reduced after fabrication of integrated circuit 18 and for example before etching the through-wafer cavity 22 or after filling through-wafer cavity with attachment material 34.

FIG. 1 illustrates first component chip 26 as comprising a single transistor having its terminals connected to contact pads 74 by vias 76. Component chip 26 can comprise a substrate and integrated circuit layers formed on top of its substrate, the thickness of the integrated circuit layers being for example only a fraction of the thickness of the substrate (for example between ⅒ and ⅟₁₀₀₀ of the thickness of the substrate). According to an embodiment of this presentation, the total thickness of component chip 26 is smaller than the total thickness of carrier wafer 12. According to an embodiment of this presentation, attachment material 34 contacts the side surfaces 32 of component chip 26 along most of their height (at least 50% of the height, starting from close to the top surface of component chip 26). Preferably, attachment material 34 contacts essentially all of the side surfaces 32 of component chip 26 and all of the bottom surface 30 of component chip 26. Preferably, attachment material 34 fills completely cavity 22, up to a level essentially flush with the bottom surface 16 of carrier wafer 12.

As detailed hereafter, attachment material 34 can be formed around component chip 26 while component chip 26 is attached temporarily (i.e. glued) by its top surface 28 to a handle wafer (not shown in FIG. 1); the top surface 14 of carrier wafer 12 being also attached temporarily to the handle wafer such that component chip 26 is maintained in its desired position in cavity 22. If such a manufacturing process is used, the top surface 28 as well as a small height of the side surfaces 32 are in contact with a temporary attachment material layer (i.e. glue layer) when material 34 is brought in cavity 22 to permanently attach component chip 26 to wafer 12, whereby said small height of the side surfaces 32 is not covered by permanent attachment material 34 and the remaining portion of the side surfaces 32 (i.e. most of the surfaces) contacts material 34. According to an embodiment of this presentation, material 34 can be a metal and can be brought into cavity 22 by electroforming/electroplating/electrodeposition to permanently attach component chip 26 to wafer 12. If electroforming is used, a film of metal can be deposited on the walls 24 of the through-cavity 22 and on the exposed surfaces of component chip 26 before said electroforming. According to an embodiment of this presentation, before such film of metal is deposited, a layer of dielectric can be deposited on the walls 24. According to an embodiment of this presentation, material 34 fills the gaps between the walls 32 of component chip 26 and the walls 24 of cavity 22. According to an embodiment of this presentation, material 34 does not necessarily cover the bottom surface 30 of component chip 26. According to an embodiment of this presentation, material 34 does cover the bottom surface 30 of component chip 26, and can actually fill cavity 22 from the bottom surface 30 of component chip 26 to the bottom surface 16 of wafer 12.

According to an embodiment of this presentation, component chip 26 and wafer 12 can be made of different materials. For example, wafer 12 can be a silicon wafer while component chip 26 can be a III-Nitride material chip. FIG. 1 illustrates first component chip 26 as comprising a single transistor, but it can comprise an integrated circuit having a plurality of transistors (and eventually passive integrated components). Silicon is an advantageous choice for wafer 12, because it takes advantage of known microelectronics fabrication processes and wafer scaling and manufacturing capabilities.

According to embodiments of this presentation, at least one contact pad 74 on component chip 26 is connected to at least one contact pad 20 on wafer 12 by a conductor 78. According to an embodiment of this presentation, conductor 78 can be formed using manufacturing processes that belong to the manufacturing steps of the process used to fabricate wafer 12. For example, conductor 78 can be formed in a top metal layer of a CMOS manufacturing process if wafer 12 was made with said CMOS manufacturing process.

According to embodiments of this presentation, portions of conductor 78 not in contact with contact pads 20 and 74 can be separated from top surfaces 14 and 28 by a dielectric layer or by an air gap. Such a conductor passing over an air gap can for example be manufactured as detailed in U.S. Pat. No. 9,837,372, which is hereby incorporated by reference.

Figure 2A:
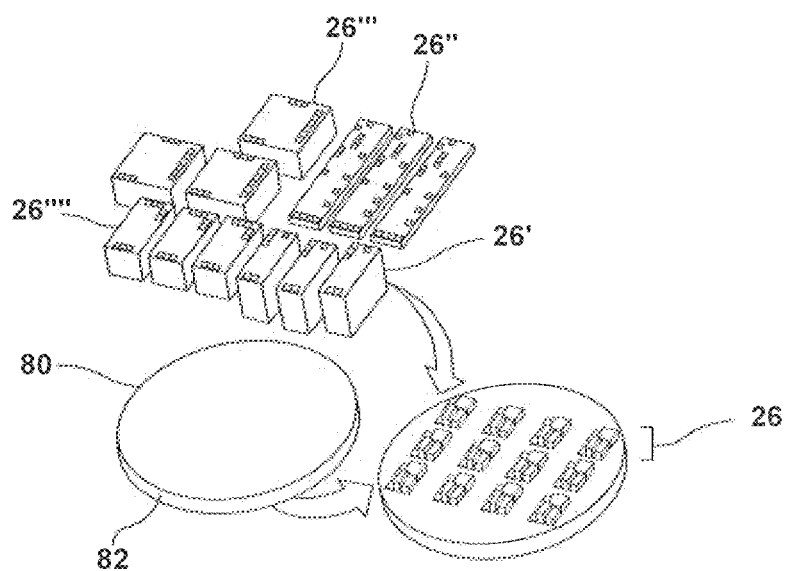
FIGS. 2A, 2B, 2C and 2D illustrate the manufacturing of electronic assemblies according to an embodiment of this presentation.

FIG. 2A illustrates first steps of manufacturing an electronic assembly according to embodiments of this presentation. At least one component chip 26 having a top, bottom and sides surfaces are provided, and its top surface attached temporarily to a surface 80 of a handle wafer 82, at a predetermined location detailed hereafter. According to embodiments of this presentation, a plurality of electronic assemblies can be manufactured simultaneously, in which case pluralities of component chips 26 are provided and attached to a plurality of predetermined locations on surface 80. As illustrated in FIG. 2A, the "component chip" 26 can actually comprise a plurality of identical or distinct component chips 26', 26", 26''' and 26'''' (four illustrated in FIG. 2A) having each top, bottom and sides surfaces, and having each their top surfaces attached temporarily to predetermined locations of surface 80. According to an embodiment of this presentation, the various component chips (e.g., 26', 26", 26''' and 26'''') can have different thicknesses (subject to the constraint that they be no thicker than wafer 12.

Component chips 26 are preferably pre-tested to verify their functionality. As a result, the yield of the final devices or "component chips" 26 (comprising integrated component chips 26', 26", 26''' and 26'''') is much improved over integration of component chips 26', 26", 26''' and 26'''' in the prior art, in which the functionality of the component chips is not verified until after integration.

Figure 2B:
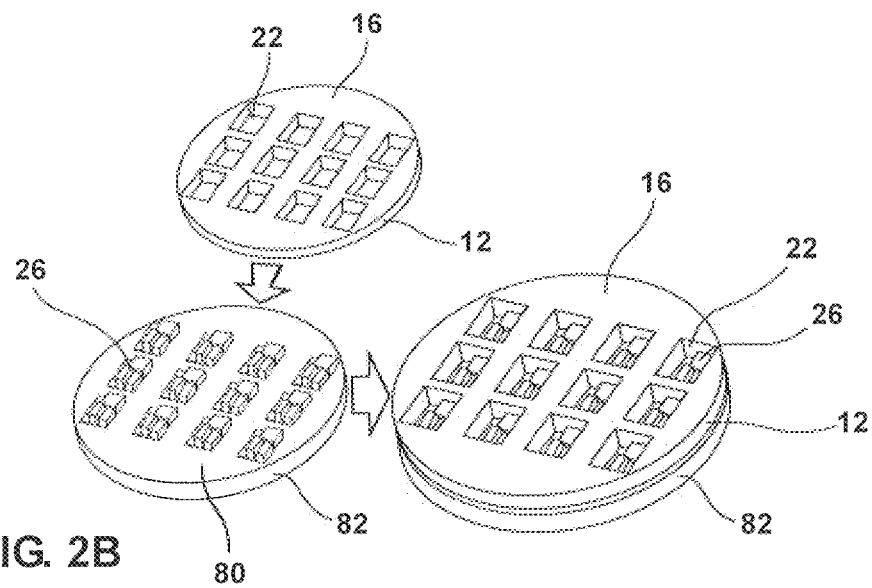

As illustrated in FIG. 2B, according to embodiments of this presentation, carrier wafer 12 is then provided, having an integrated circuit with a contact pad on its top surface (not seen in FIG. 2B, which shows a bottom surface 16) and having a through-wafer cavity 22 in the vicinity of contact pad 20 (not seen in FIG. 2B). Then, the top wafer surface of the carrier wafer 12 is attached to the surface 80 of the handle wafer 82 such that the first component chip 26 is arranged within the through-wafer cavity 22. Thus, the predetermined position where component chip 26 is attached to surface 80 is chosen as a function of the position of integrated circuit 18 (not seen in FIG. 2B) and through-wafer cavity 22. Advantageously, component chip 26 is arranged on surface 80 such that when component chip 26 is arranged within the through-wafer cavity 22, handle wafer 82 and carrier wafer 12 are aligned vertically. As illustrated in FIG. 2B, when a plurality of component chips 26 are attached to surface 80, carrier wafer 12 is provided with a corresponding number of through-wafer cavities 22, provided each for receiving one component chip 26 when wafers 12 and 82 are attached.

Figure 2C:
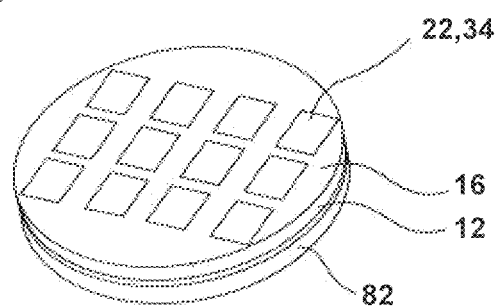

As illustrated in FIG. 2C, according to embodiments of this presentation, at least a portion of each through-wafer cavity 22 is filled with an attachment material 34 such that at least one wall of the through-wafer cavity 22 is attached to at least one of the bottom surface of component chip 26 and one side surface of component chip 26. As illustrated in FIG. 2C, attachment material 34 can completely fill each cavity 22 and eventually be flush with bottom surface 16 of wafer 12. As outlined above, attachment material 34 can be a metal, and the cavities 22 can be filled with material 34 by, for example, electroforming after depositing a thin layer of conductive material in the cavities 22.

Figure 2D:
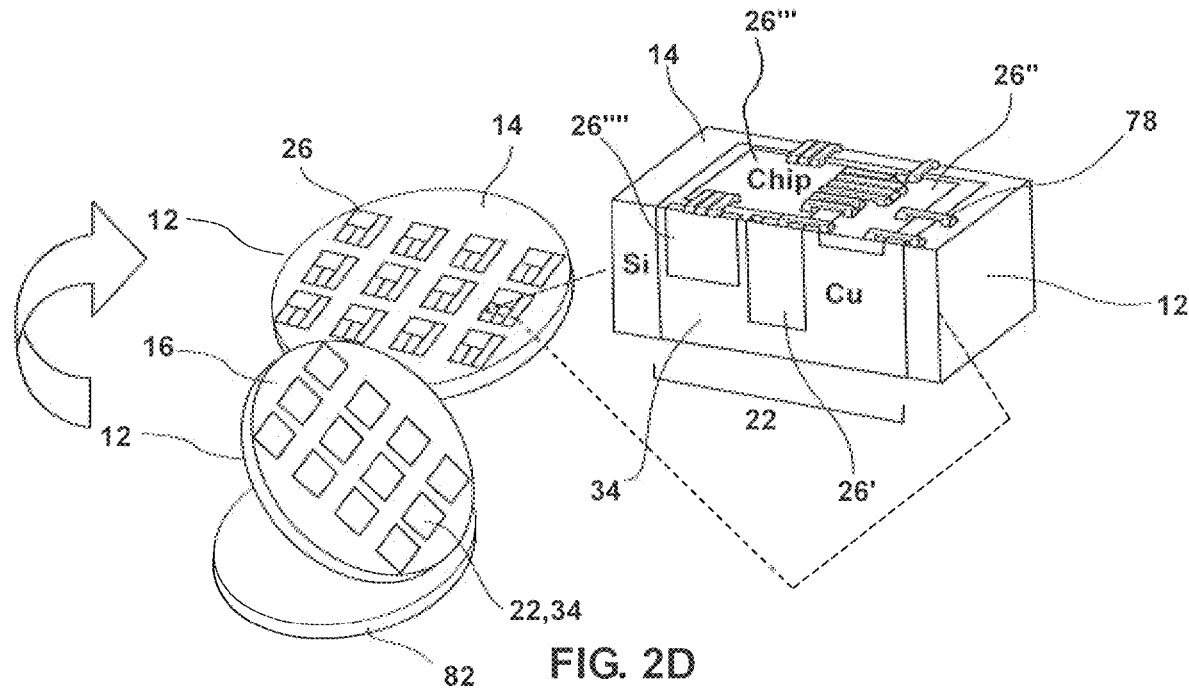

As illustrated in FIG. 2D, according to embodiments of this presentation, handle wafer 82 is then detached from carrier wafer 12 (and component chip 26). Because component chip 26 is then attached inside cavity 22 by material 34, component chip 26 is maintained in cavity 22 in the position it had relative to wafer 12 when they were attached to wafer 82. FIG. 2D shows wafer 12 both with its bottom surface 16 turned upward (when wafer 12 is separated from wafer 82) and downward (showing the top surface of component chip 26 flush with the top surface 14 of wafer 12). For clarity, contact pads 20 and integrated circuits 18 are not shown in FIG. 2D. FIG. 2D also shows an enlarged cross-section of a portion of wafer 12 showing component chip 26 (actually showing a plurality of component chips 26', 26", 26''', 26'''') attached to the walls of a cavity 22 by attachment material 34. According to embodiments of this presentation, conductors 78 are then formed between contact pads (not shown) of component chip 26 and of integrated circuit 18 on the top surface of component chip 26 and wafer 12. According to an embodiment of this presentation, component chip 26 (or any of component chip 26', 26", 26''', 26'''') can be arranged such that a surface fabricated as a side surface is arranged and maintained parallel to the top surface of wafer 12. This capability can be used to increase the number of component chips 26 embedded in wafer 12, and/or when the side surface of component chip 26 maintained parallel to the top surface of wafer 12 has a specific function. This might be the case, for example, when component chip 26 is a semiconductor laser chip and its side surface is a laser emitting side.

Figure 3:
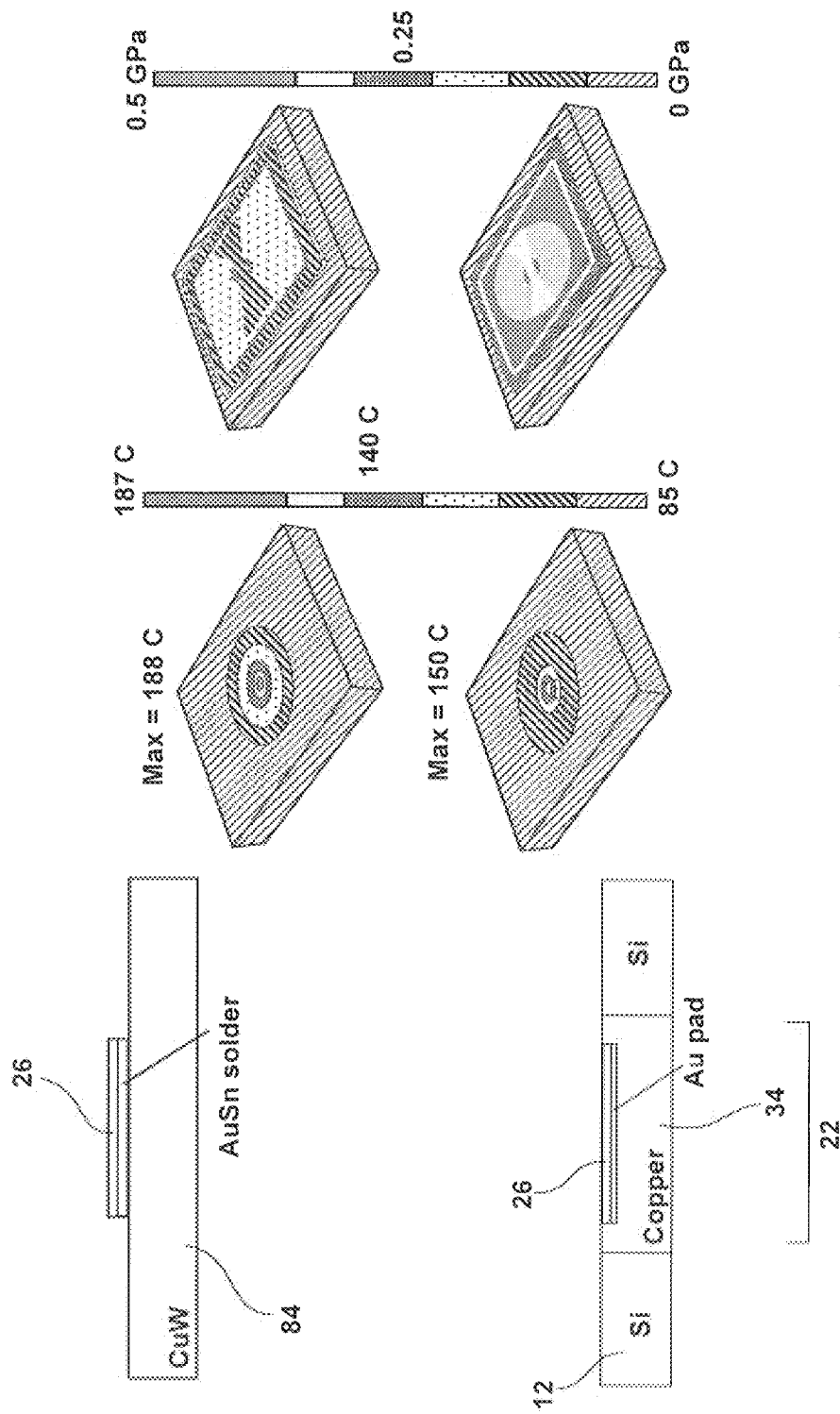
FIG. 3 illustrates some features of an electronic assembly according to embodiments of this presentation.

FIG. 3 illustrates schematically in its lower part a component chip 26 embedded in a cavity 22 of a portion of a Si wafer 12 by a metallic attachment material 34 (Cu, in this case), along with the heat and mechanical strain distribution in component chip 26 when component chip 26 is activated. FIG. 3 also illustrates schematically in its upper part a same power component chip 26 having its bottom attached to a CuW heat sink 84 of about the same size as the portion of Si wafer 12, along with the heat and mechanical strain distribution in component chip 26 when component chip 26 is activated. FIG. 3 compares two cases simulated with Comsol thermo-mechanical finite element modeling software at a constant power dissipated by a hot spot (e.g., active transistor region) in the center of the top surface of the component chip 26. The architecture shown in the lower part allows for a significant improvement in heat dissipation (e.g., up to 38 degrees in this configuration). The reason for this increase in heat dissipation is two-fold: 1) the higher thermal conductivity of material 34 (Cu, in this case) compared to CuW heat sink 84, and the elimination of the die attach material AuSn solder—a mediocre thermal conductor material. Although the strain increases in the chip (shown on the right hand side), it is still below the yield strength of the materials.

The inventors have noted that the embedding of a component chip 26 (comprising a single chip or a plurality of component chips 26', etc., as outlined above) in a metal-filled cavity allows to significantly drain any chip-produced heat, which in return limits significantly any size change due to a temperature change, and allows any mechanical strain due to such size change to remain moderate, even though metal is not resilient. The inventors have noted that the heat drain can even be improved by connecting the bottom of material 34 to a metal layer or plate, formed on at least a portion of the bottom surface of wafer 12. As illustrated in FIG. 3, a thin layer of metal (for example, gold) can be formed on the bottom of component chip 26. Doing so improves the interface between component chip 26 and material 34, and also facilitates the filling of cavity 22 when done using electroforming. It is noted that material 34 can also be non-metallic, in which case it can be chosen to be a material with greater pliability, although at the expense of having a reduced thermal conductivity. According to an embodiment, if material 34 is not conductive, a via (not shown) can be provided through material 34 to allow contacting thermally and/or electrically the bottom surface of component chip 26 with a metal layer or plate on the bottom surface of wafer 12.

FIG. 4 outlines a method 400 of manufacturing an electronic assembly according to embodiments of this presentation, where the handle wafer 12 is alternatively called an "interposer" wafer and the through-wafer cavities 22 are alternatively called "wafer-level" cavities. The component chips 26 are called "transistor component chiplets", the handle wafer 82 a "temporary wafer", the attachment material 34 a "metal". In the embodiment illustrated in FIG. 4, wafer 12 can be thinned, for example, on the side of its bottom surface 16 before wafer 12 is attached to the handle wafer 82.

According to an embodiment of this presentation, process 400 comprises in 400 fabricating a carrier wafer (such as 12 in FIG. 1); or "interposer" wafer, where the carrier wafer can comprise an integrated circuit (such as 18 in FIG. 1), which can itself comprise resistors, capacitors, through-substrate vias, dielectric/metal stacks, etc. . . . According to an embodiment, the carrier wafer/interposer wafer can be thinned (404), for example by a mechanical and/or chemical polishing of one face of the carrier wafer. In 406, at least one wafer-level cavity (such as cavity 22 in FIG. 1) is etched in the carrier wafer; and optionally, in 408, a dielectric padding can be formed on the sidewalls of the cavity, so as to ensure electrical isolation between the circuits inside the cavity and the integrated circuit in the carrier wafer.

In 410, one or more component chips (such as 26 in FIG. 1; which can be high-end transistor chiplets) are attached face-down to a temporary wafer/handle wafer (such as 82 in FIG. 2A); for example by pick-and place automated assembly.

In 412, after the temporary wafer has been temporarily attached to the carrier wafer such that the one or more component chips are within the cavity in the carrier wafer, the cavity is filled (at least partially) for example with a metal, thus locking the component chips in place in the cavity. When the cavity is filled with metal, the metal can provide a backside grounding of the component chips; as well as a high-thermal conductivity interface.

In 414, the temporary wafer is detached from the carrier wafer and the component chips, and in 416 the face of the component chips can be connected with the integrated circuit of the carrier wafer, for example using one or more layers of metal and dielectric; or metal air bridges; or metal wires. In 418, where carrier wafer comprises a plurality of integrated circuits and component chips, the carrier wafer can be diced to produce a plurality of composite chips.

FIG. 5 outlines a process of manufacturing an electronic assembly according to embodiments of this presentation; the process comprising:

Providing 90 a first component chip 26 having a first component chip top surface 28, a first component chip bottom surface 30 and first component chip side surfaces 32; said first component chip 26 comprising at least one first component contact pad 74 on said first component chip top surface 28;

Providing 92 a handle wafer 82 having a first surface 80;

Attaching 94 said first component chip top surface 28 to said first surface 80 of said handle wafer 82;

Providing 96 a carrier wafer 12 having a top wafer surface 14 and a bottom wafer surface 16;

Forming 98 in the carrier wafer 12 an electronic integrated circuit 18 having a first integrated circuit contact pad 20 on the top wafer surface 14;

Forming 100 in the carrier wafer 12 a through-wafer cavity 22 having walls 24 that join said top wafer surface 14 to said bottom wafer surface 16;

Attaching 102 said top wafer surface 14 to said first surface 80 of said handle wafer 82 such that said first component chip 26 is arranged within said through-wafer cavity 22;

Filling 104 at least a portion of said through-wafer cavity 22 with an attachment material 34 attaching at least one wall 24 of the through-wafer cavity 22 to at least one of the first component chip bottom surface 30 and one first component chip side surface 32 (bottom metal layer 36 can optionally be formed after filling cavity 22 in particular if attachment material 34 is metal);

Detaching 106 the handle wafer 80 from the first component chip top surface 28 and the top wafer surface 14; and Forming 108 a first conductor 78 between the first integrated circuit contact pad 20 and said first component contact pad 74.

Advantageously, by allowing component chips 26 to be manufactured separately from wafer 12, embodiments of the present disclosure allow testing component chips 26 and wafer 12 separately before assembling them. In case one of the two components (for example, component chip 26) has poor fabrication yields, embodiments of the present disclosure allow improving significantly the fabrication yield of a completed product having a plurality of component chips 26 together in a cavity.

Further, because embodiments of this presentation allow fabricating integrated circuit 18 separately from component chip 26, component chip 26 does not need to be exposed to steps in the fabrication of integrated circuit 18 that could potentially damage component chip 26. Thus, embodiments of this presentation allow for example to reduce manufacturing costs by using only very small component chips 26 having specific features and made of exotic expensive materials, in combination with integrated circuit 18 having more common features and made of cheaper common materials.

According to embodiments of this presentation, component chip 26 can comprise a GaN, InP or GaAs component and it can be fabricated on a substrate such as Si, SiGe, InP, GaAs, Alumina, or diamond.

According to an embodiment of this presentation, the integrated circuit 18 of carrier wafer 12 can comprise metal routing and passive components fabricated at the wafer scale.

According to an embodiment of this presentation, interconnection 78 can be made using conductors made out of thin films, thick, plated interconnects, multi-layers, etc. The interconnections can for example be made using the back-end steps of a manufacturing process.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step (s) of . . . ."

All elements, parts and steps described herein are preferably included. It is to be understood that any of these elements, parts and steps may be replaced by other elements, parts and steps or deleted altogether as will be obvious to those skilled in the art.

What is claimed:

1. An electronic assembly, comprising:
   a carrier wafer having a top wafer surface and a bottom wafer surface; an electronic integrated circuit being formed in the carrier wafer and comprising a first integrated circuit contact pad on the top wafer surface;

said carrier wafer comprising a through-wafer cavity having walls that join said top wafer surface to said bottom wafer surface;

a first component chip having a first component chip top surface, a first component chip bottom surface and first component chip side surfaces, the first component chip being held in said through-wafer cavity by direct contact of at least a side surface of said first component chip with an attachment metal that fills at least a portion of said through-wafer cavity;

said first component chip comprising at least one first component contact pad on said first component chip top surface; and a first conductor connecting said first integrated circuit contact pad and said first component contact pad.

2. The electronic assembly of claim 1, wherein the attachment metal holds the first component chip such that the first component chip top surface is flush with the top wafer surface.

3. The electronic assembly of claim 1, wherein a metal layer covers at least a portion of the bottom wafer surface as well as the attachment metal in the cavity.

4. The electronic assembly of claim 1, wherein the walls of the through-wafer cavity are covered with a dielectric layer.

5. The electronic assembly of claim 1, wherein the attachment metal contacts at least most of each first component chip side surface.

6. The electronic assembly of claim 1, wherein the carrier wafer and the first component chip are made of different materials.

7. The electronic assembly of claim 1, wherein the first component chip is an integrated circuit chip comprising one or more transistors.

8. The electronic assembly of claim 1, wherein the carrier wafer and the first component chip have a different thickness.

9. The electronic assembly of claim 1, comprising a second component chip also held in said through-cavity by direct contact of at least a side surface of said second component chip with said attachment metal; said second component chip comprising at least one second component contact pad on a top surface of the second component chip;

the electronic integrated circuit formed in the carrier wafer comprising a second integrated circuit contact pad on the top wafer surface; wherein a second conductor connects the second integrated circuit contact pad and the second component contact pad.

10. The electronic assembly of claim 9, wherein:

the attachment metal holds the first component chip such that the first component chip top surface is flush with the top wafer surface; and the attachment metal holds the second component chip such that the top surface of the second component chip is flush with the top wafer surface.

11. A method of manufacturing an electronic assembly, comprising:

providing a first component chip having a first component chip top surface, a first component chip bottom surface and first component chip side surfaces; said first component chip comprising at least one first component contact pad on said first component chip top surface;

providing a handle wafer having a first surface;

attaching said first component chip top surface to said first surface of said handle wafer;

providing a carrier wafer having a top wafer surface and a bottom wafer surface;

forming in the carrier wafer an electronic integrated circuit having a first integrated circuit contact pad on the top wafer surface;

forming in the carrier wafer a through-wafer cavity having walls that join said top wafer surface to said bottom wafer surface;

attaching said top wafer surface to said first surface of said handle wafer such that said first component chip is arranged within said through-wafer cavity;

filling at least a portion of said through-wafer cavity with an attachment metal so as to hold the first component chip in said through-wafer cavity by direct contact of at least a side surface of said first component with said attachment metal;

detaching the handle wafer from the first component chip top surface and the top wafer surface; and forming a first conductor between the first integrated circuit contact pad and said first component contact pad.

12. The method of claim 11, wherein said filling at least a portion of said through-cavity with said attachment metal comprises:

depositing said attachment metal by electroplating.

13. The method of claim 12, wherein said filling at least a portion of said through-cavity with said attachment metal comprises depositing a film of metal on at least one wall of the through-cavity and at least one of the first component chip bottom surface and one first component chip side surface before said electroplating.

14. The method of claim 12, wherein said filling at least a portion of said through-cavity with said attachment metal comprises filling the cavity up to the bottom wafer surface with said attachment material;

the method further comprising covering with a metal layer at least a portion of the bottom wafer surface as well as the attachment material in the cavity.

15. The method of claim 11, comprising covering the walls of the through-wafer cavity with a dielectric layer before said filling at least a portion of said through-wafer cavity with an attachment metal.

16. The method of claim 11, wherein the carrier wafer and the first component chip are made of different semiconductor materials.

17. The method of claim 11, wherein said forming in the carrier wafer an electronic integrated circuit having a first integrated circuit contact pad on the top wafer surface comprises forming in the carrier wafer an electronic integrated circuit having a first and a second integrated circuit contact pads on the top wafer surface;

the method further comprising:

providing a second component chip having a top surface with a second component contact pad;

attaching said top surface of the second component chip to said first surface of said handle wafer in a vicinity of said first component chip such that, when said top wafer surface is attached to said first surface of said handle wafer, both the first component chip and the second component chip are arranged within said through-wafer cavity;

wherein said attachment metal also holds the second component chip in said through-wafer cavity by direct contact of at least a side surface of said second component chip with said attachment metal; and after detaching the handle wafer from the top chip surface and the top wafer surface;

forming a second conductor between the second integrated circuit contact pad and the second component contact pad.

18. The method of claim 17, wherein:

the attachment metal embeds the first component chip such that the first component chip top surface is flush with the top wafer surface; and the attachment metal embeds the second component chip such that the top surface of the second component chip is flush with the top wafer surface.

19. The electronic assembly of claim 10, wherein the first component chip and the second component chip have a different thickness.

* * * * *